(12) United States Patent
Kosakai et al.

(10) Patent No.: US 10,256,131 B2
(45) Date of Patent: Apr. 9, 2019

(54) ELECTROSTATIC CHUCK DEVICE (71) Applicant: SUMITOMO OSAKA CEMENT CO., LTD., Tokyo (JP)

(72) Inventors: Mamoru Kosakai, Tokyo (JP); Shinichi Maeta, Tokyo (JP); Keisuke Maeda, Tokyo (JP)

(73) Assignee: SUMITOMO OSAKA CEMENT CO., LTD., Tokyo (JP)

( * ) Notice: Subject to any disclaimer, the term of this patent is extended or adjusted under 35 U.S.C. 154(b) by 0 days.

(21) Appl. No.: 15/752,863

(22) PCT Filed: Aug. 9, 2016

(86) PCT No.: PCT/JP2016/073428
§ 371 (c)(1),
(2) Date: Feb. 14, 2018

(87) PCT Pub. No.: WO2017/033738
PCT Pub. Date: Mar. 2, 2017

(65) Prior Publication Data
US 2018/0254211 A1 Sep. 6, 2018

(30) Foreign Application Priority Data
Aug. 27, 2015 (JP) .................. 2015-168230

(51) Int. Cl.
H01L 21/683 (2006.01)
H01L 21/3065 (2006.01)
(Continued)

(52) U.S. Cl.
CPC ............ *H01L 21/6833* (2013.01); *B23Q 3/15* (2013.01); *H01L 21/3065* (2013.01);
(Continued)

(58) Field of Classification Search
USPC ........................................ 361/234
See application file for complete search history.

(56) References Cited

U.S. PATENT DOCUMENTS

| 2002/0021545 A1 | 2/2002 | Tatsumi et al. | |
| 2009/0310274 A1* | 12/2009 | Koyama | H01L 21/67248 361/234 |
| 2010/0039747 A1* | 2/2010 | Sansoni | H01L 21/6833 361/234 |

FOREIGN PATENT DOCUMENTS

| JP | 08-316299 A | 11/1996 |
| JP | 09-213773 A | 8/1997 |

(Continued)

OTHER PUBLICATIONS

International Search Report for PCT/JP2016/73428 (dated Nov. 1, 2016).

(Continued)

Primary Examiner — Danny Nguyen
(74) Attorney, Agent, or Firm — Merchant & Gould P.C.

(57) ABSTRACT

An electrostatic chuck device includes an electrostatic chuck member and a temperature controlling base member. The electrostatic chuck member has a ceramic plate having a mounting surface on which a plate-shaped sample is mounted, and an electrode for electrostatic attraction provided on the other surface on the side opposite the mounting surface of the ceramic plate. The temperature controlling base member is disposed on the surface on the side opposite the ceramic plate side of the electrode for electrostatic attraction and cools the electrostatic chuck member. The ceramic plate has a dike portion which extends to the temperature controlling base member side and surrounds the electrode for electrostatic attraction, the temperature controlling base member has a groove portion accommodating an end part of the dike portion, and a space between the groove portion and the dike portion is filled with a filling part formed of a resin material.

10 Claims, 3 Drawing Sheets (51) Int. Cl.
    *H02N 13/00*     (2006.01)
    *B23Q 3/15*     (2006.01)
    *H01L 21/67*     (2006.01)

(52) U.S. Cl.
    CPC .. *H01L 21/67109* (2013.01); *H01L 21/67248* (2013.01); *H01L 21/683* (2013.01); *H01L 21/6835* (2013.01); *H02N 13/00* (2013.01)

(56) References Cited

FOREIGN PATENT DOCUMENTS

| | | |
|---|---|---|
| JP | 2001-308165 A | 11/2001 |
| JP | 2002-064134 A | 2/2002 |
| JP | 2004-071791 A | 3/2004 |
| JP | 2004-079588 A | 3/2004 |
| JP | 2005-347559 A | 12/2005 |
| JP | 2007-110023 A | 4/2007 |
| JP | 2009-503816 A | 1/2009 |
| JP | 2015-515760 A | 5/2015 |
| JP | 2015-517224 A | 6/2015 |
| WO | 2013/162820 A1 | 10/2003 |
| WO | 2007/011613 A2 | 1/2007 |
| WO | 2007/145070 A1 | 12/2007 |
| WO | 2013/162641 A1 | 10/2013 |

OTHER PUBLICATIONS

Notice of Allowance for Japanese Patent Application No. 2016-556915 (dated Mar. 7, 2017).

\* cited by examiner

ELECTROSTATIC CHUCK DEVICE

TECHNICAL FIELD

The present invention relates to an electrostatic chuck device.

This application is a National Stage Application under 35 U.S.C. § 371 of International Application No. PCT/JP2016/073428 filed on Aug. 9, 2016, which claims the benefit of priority to Japanese Patent Application No. 2015-168230 filed on Aug. 27, 2015, the disclosures of all of which are incorporated herein by reference in their entireties. The International Application was published in Japanese on Mar. 2, 2017 as WO 2017/033738.

BACKGROUND

In a semiconductor manufacturing apparatus, in the past, as a device for simply mounting and fixing a plate-shaped sample such as a wafer or a glass substrate to a sample stage, an electrostatic chuck device using an electrostatic attraction mechanism has been used. As the configuration of the electrostatic chuck device of the related art, there is known a configuration having an attraction plate having a structure in which an electrode is buried in a dielectric body, and a support body for supporting the attraction plate through an adhesive. In such an electrostatic chuck device, the adhesive is etched by plasma or the like which is used in a semiconductor manufacturing process, and thus there is a case where the performance of the electrostatic chuck device is affected. For this reason, in the electrostatic chuck device described in Patent Literature No. 1, a stepped shape is provided in an attraction plate so as to lengthen a path of the adhesive, thereby delaying a time until an attraction layer disappears.

CITATION LIST

Patent Literature

[Patent Literature No. 1] Japanese Laid-open Patent Publication No. 2007-110023

SUMMARY OF INVENTION

Technical Problem

However, in a case where the stepped shape is formed on the attraction plate, as described in Patent Literature No. 1, the effect of lengthening the path of the adhesive is insufficient, and thus the life of the electrostatic chuck device cannot be sufficiently prolonged.

The present invention has been made in view of such circumstances and has an object to provide an electrostatic chuck device in which it is possible to prolong the life.

Solution to Problem

In order to solve the above problem, the present invention provides the following devices.

That is, an electrostatic chuck device according to a first aspect of the present invention is the following device.

The electrostatic chuck device according to the first aspect includes: an electrostatic chuck member; and a temperature controlling base member, in which the electrostatic chuck member includes a ceramic plate whose one surface is a mounting surface to mount a plate-shaped sample, and an electrode for electrostatic attraction which is provided on a surface side of the ceramic plate which is opposite to the mounting surface side, the temperature controlling base member is configured to cool the electrostatic chuck member and is disposed on a surface side of the electrode for electrostatic attraction which is opposite to the ceramic plate side, the ceramic plate includes a dike portion extending to the temperature controlling base member side and surrounding a periphery of the electrode for electrostatic attraction, the temperature controlling base member includes a groove portion that is configured to accommodate an end part of the dike portion, and a space between the groove portion and the dike portion is filled with a filling part which is formed of a resin material.

The electrostatic chuck device according to the first aspect preferably includes the following features. These features may be combined with each other.

The dike portion has a closed-circular shape, and the groove portion is provided with a closed-circular groove which corresponds to the dike portion.

The dike portion has a step provided at the dike portion, in which a width of the dike portion decreases in a stepwise manner toward the end part of the dike portion and the end part is positioned on the temperature controlling base member side, and the groove portion has a step provided at the groove portion, in which a width decreases toward a bottom side corresponding to the step provided at the dike portion.

The end part of the dike portion, in which the end part is positioned at the temperature controlling base member side, is a chamfered end part.

An exposed portion of the filling part which is exposed to the outside is covered with an O-ring.

The electrostatic chuck device further includes: an adhesive layer which adheres the electrostatic chuck member and the temperature controlling base member to each other, in which the adhesive layer includes the filling part, and an interposing part, which is positioned between the electrode for electrostatic attraction and the temperature controlling base member.

The adhesive layer is divided into a portion formed of a first resin material, and a portion formed of a second resin material which has higher plasma resistance than that of the first resin material, and an exposed portion of the adhesive layer, which is exposed to the outside, is formed of the second resin material.

The electrostatic chuck device further includes: a first organic insulating layer which is provided between the ceramic plate and the electrode for electrostatic attraction.

The electrostatic chuck device further includes: a second organic insulating layer which is provided between the temperature controlling base member and the electrode for electrostatic attraction.

An electrostatic chuck device according to a second aspect of the present invention is the following device. The electrostatic chuck device according to the second aspect can likewise preferably include the preferred features of the electrostatic chuck device according to the first aspect.

The electrostatic chuck device according to the second aspect includes: a ceramic plate; and a temperature controlling base member, in which the ceramic plate whose one surface is amounting surface to mount a plate-shaped sample, an electrode for electrostatic attraction is provided on the ceramic plate, the temperature controlling base member is configured to cool the ceramic plate from a side opposite to the mounting surface of the ceramic plate, the ceramic plate includes a dike portion extending to the temperature controlling base member side and surrounding a periphery of the electrode for electrostatic attraction, the temperature controlling base member includes a groove portion that is configured to accommodate an end part of the dike portion, and a space between the groove portion and the dike portion is filled with a filling part formed of a resin material.

The device according to the second aspect can likewise preferably include the preferred examples or the preferred conditions of the device according to the first aspect.

Advantageous Effects of Invention

According to the present invention, an electrostatic chuck device in which it is possible to prolong the life can be provided.

DESCRIPTION OF EMBODIMENTS

The examples which are described below are examples which specifically describe the present invention in order to make the gist of the invention better understood, and do not limit the present invention unless otherwise specified. Omissions, additions, changes, substitutions, exchanges, and other changes can be made with respect to the number, positions, sizes, members, or the like within a scope which does not depart from the gist of the present invention.

First Embodiment

Hereinafter, an electrostatic chuck device 1 according to a first embodiment which is a preferred example of the present invention will be described with reference to FIG. 1. In the drawings which are used in the following description, in order to make the features easy to understand, there is a case where characteristic portions are shown in an enlarged manner for convenience. Therefore, dimensions, ratios, or the like of the respective constituent elements is not necessarily the same as the actual.

Figure 1:
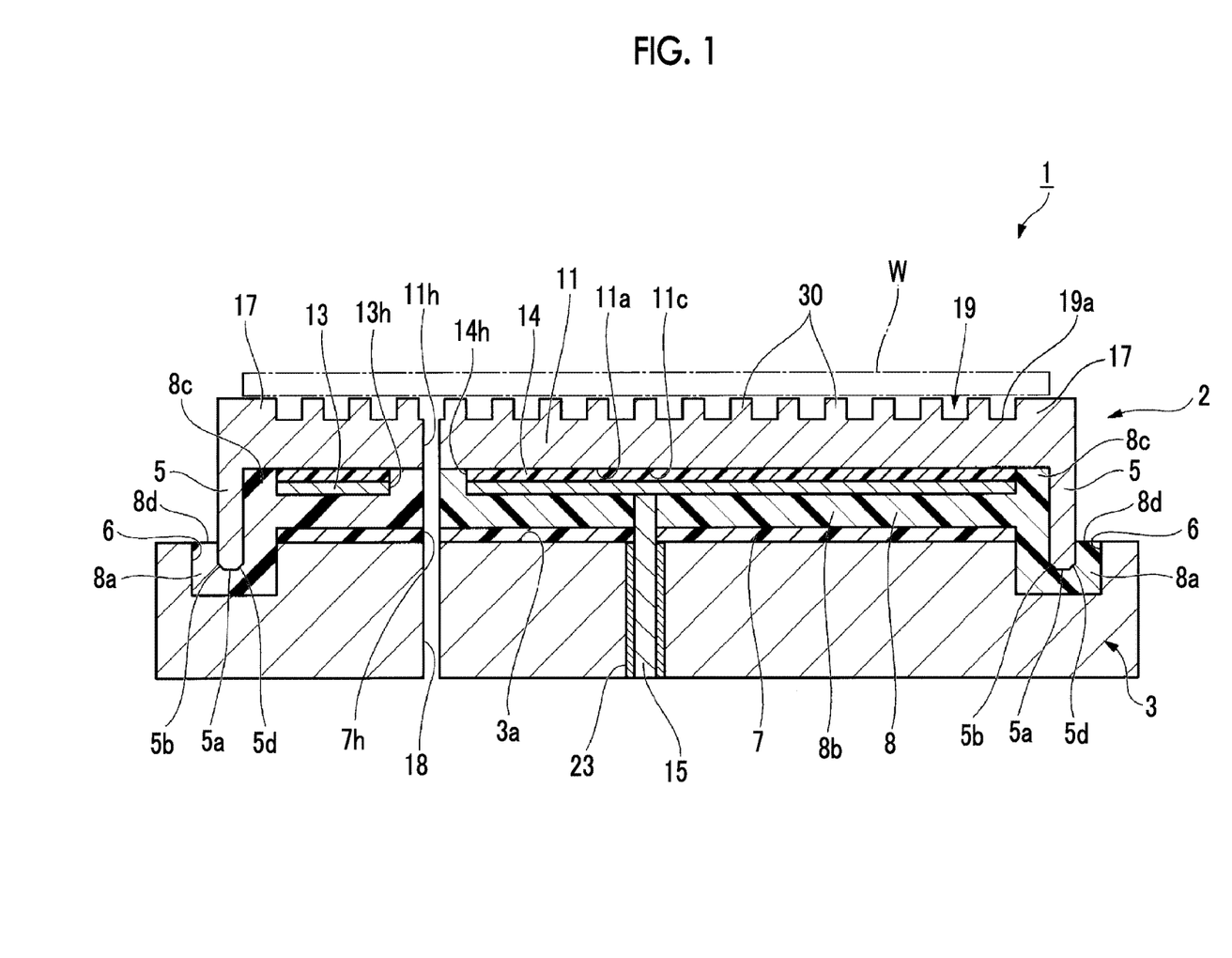
FIG. 1 is a sectional view showing a preferred example of an electrostatic chuck device according to a first embodiment.

FIG. 1 is a sectional view of the electrostatic chuck device 1. The electrostatic chuck device 1 of this embodiment has a circular shape when viewed in a planar view. The electrostatic chuck device 1 is provided with an electrostatic chuck member 2 having an upper surface which is amounting surface 19 on which a plate-shaped sample W such as a semiconductor wafer is mounted, a temperature controlling base member 3 for controlling the temperature of the electrostatic chuck member 2 to a desired temperature, an adhesive layer 8 for bonding and integrating the electrostatic chuck member 2 and the temperature controlling base member 3 together, a power supply terminal 15, and an organic insulating layer (a second organic insulating layer) 7.

In the following description, there is a case where the relative positions of the respective configurations are represented with the mounting surface 19 side indicated as an "upper side" and the temperature controlling base member 3 side indicated as a "lower side". Further, the position of each part will be explained with an "outside (or an outside in a radial direction)" and an "inside (or an inside in a radial direction)" set on the basis of the radial direction with respect to a central axis extending in an up-down direction of the electrostatic chuck device 1.

The electrostatic chuck member 2 has a mounting plate (a ceramic plate) 11 having one surface (an upper surface) which is the mounting surface 19 on which the plate-shaped sample W such as a semiconductor wafer is mounted, an electrode for electrostatic attraction 13 provided on the surface (the other surface) on the side opposite to the mounting surface 19 of the mounting plate 11, and a first organic insulating layer 14 provided between the mounting plate 11 and the electrode for electrostatic attraction 13.

A plurality of protrusion portions 30 each having a diameter smaller than the thickness of the plate-shaped sample W are formed on the mounting surface 19 of the electrostatic chuck member 2. The electrostatic chuck device 1 has a configuration in which the plurality of protrusion portions 30 support the plate-shaped sample W. A peripheral wall 17 is formed at the periphery of the mounting surface 19. The peripheral wall 17 is formed at the same height as the protrusion portions 30 and supports the plate-shaped sample W together with the protrusion portions 30.

The mounting plate 11 has a dike portion 5 which extends from the periphery of a lower surface 11a on the side opposite to the mounting surface 19 toward the temperature controlling base member 3 side (that is, the lower side). The dike portion 5 surrounds the first organic insulating layer 14 and the electrode for electrostatic attraction 13, which are positioned on the lower surface 11a side of the mounting plate 11, from the outside in the radial direction. In this embodiment, the shape of the dike portion 5 when viewed in a planar view is an annular shape. The mounting plate 11 having the dike portion 5 can be formed, for example, by forming a recess portion 11c by performing countersinking on the ceramic plate. The thickness (that is, the width dimension in the radial direction of the electrostatic chuck device 1) of the dike portion 5 is preferably 0.3 mm or more and 1.0 mm or less. By adopting such a thickness, it is possible to enhance the temperature responsiveness of the mounting plate 11 by suppressing the heat capacity of the mounting plate 11 while securing sufficient mechanical strength.

The dike portion 5 is provided, whereby the side surface sides of the first organic insulating layer 14 and the electrode for electrostatic attraction 13 are covered with ceramics in which the durability against plasma is higher than that of the adhesive layer 8, through the adhesive layer 8 surrounding the electrode. For this reason, the first organic insulating layer 14 and the electrode for electrostatic attraction 13 are reliably protected from the plasma, compared to a case where the dike portion 5 is not provided. With this structure, in a case where a high voltage is applied to the electrode for electrostatic attraction 13, it is difficult for an electric discharge to occur from the side surfaces of the first organic insulating layer 14 and the electrode for electrostatic attraction 13, and thus the withstand voltage of the entire device can be improved.

An end part 5a on the lower side of the dike portion 5 is accommodated in a groove portion 6 provided in an upper surface 3a of the temperature controlling base member 3. That is, the end part 5a of the dike portion 5 reaches a position on the lower side than the upper surface 3a of the temperature controlling base member 3. A chamfered portion 5b is provided on the end part 5a on the lower side of the dike portion 5. In the mounting plate 11 made of ceramic, a corner portion tends to become a starting point of cracking. Chamfering is performed on the end part 5a of the dike portion, whereby a sharp corner portion is removed, and thus it is possible to suppress the occurrence of cracks in the mounting plate 11. It is preferable that the chamfered dimension of the end part 5a of the dike portion 5 is 0.05 mm or more and 0.1 mm or less, as an example. For the chamfered portion 5b of the illustrated example, linear chamfering is exemplified. However, rounded chamfering may be performed.

The mounting plate 11 can be formed of a material which is arbitrarily selected. However, it is preferable that the mounting plate 11 is made of an insulating ceramic sintered compact having mechanical strength and having durability against corrosive gas and plasma thereof, such as an aluminum oxide-silicon carbide ($Al_2O_3$—SiC) compound sintered compact, an aluminum oxide ($Al_2O_3$) sintered compact, an aluminum nitride (AlN) sintered compact, or an yttrium oxide ($Y_2O_3$) sintered compact.

The average particle diameter of ceramic particles in the ceramic sintered compact can be arbitrarily selected. However, the average particle diameter is preferably 10 μm or less, more preferably 5 μm or less, and further preferably 2 μm or less. Sandblasting is performed in a process of forming the protrusion portions 30 which are provided on the mounting surface 19 of the electrostatic chuck member 2. The sandblasting process is a process of performing excavation by spraying an abrasive or the like onto the front surface of the mounting surface 19. For this reason, there is a case where cracks remain in the protrusion portions 30. The cracks are forcibly removed in advance by buffing which is performed after the sandblasting process.

The cracks are easily formed at grain boundaries of the ceramic particles in the ceramic sintered compact. Therefore, in a case where the particle diameter of the ceramic particle is large, corner portions are greatly removed along the grain boundaries by undergoing the buffing. The larger the particle diameter of the ceramic particle is, the more rounded the shape of the protrusion portion 30 is. As will be described later, it is preferable that the protrusion portion 30 of this embodiment does not have a change in cross-sectional area in a height direction. Therefore, it is preferable that the protrusion portion 30 is not rounded. By setting the average particle diameter of the ceramic particles to be 10 μm or less (more preferably, 2 μm or less), it is possible to form the protrusion portion 30, in which a change in cross-sectional area in the height direction is suppressed, on the mounting surface 19.

The thickness from the upper surface of the mounting plate 11 to the lower surface of the electrode for electrostatic attraction 13, that is, the thickness of the electrostatic chuck member 2 can be arbitrarily selected. However, the thickness is preferably 0.3 mm or more and 5.0 mm or less. If the thickness of the electrostatic chuck member 2 is 0.3 mm or more, it is possible to sufficiently secure the mechanical strength of the electrostatic chuck member 2. On the other hand, if the thickness of the electrostatic chuck member 2 is 5.0 mm or less, the heat capacity of the electrostatic chuck member 2 does not become too large, and thus the thermal responsiveness of the plate-shaped sample W which is mounted thereon does not deteriorate.

Further, according to an electrostatic chuck device, there is a case of adopting a configuration in which a heater divided into a plurality of zones is provided between the electrode for electrostatic attraction 13 and the temperature controlling base member 3 to control an in-plane temperature distribution of the plate-shaped sample W. In such an electrostatic chuck device, if the thickness of the electrostatic chuck member 2 exceeds 5.0 mm, due to an increase in thermal conduction in a lateral direction of the electrostatic chuck member 2, there is a case where it becomes difficult to maintain the in-plane temperature of the plate-shaped sample W at a desired temperature pattern.

The thickness of the mounting plate 11 can be arbitrarily selected. However, the thickness is preferably 0.3 mm or more and 1.0 mm or less. If the thickness of the mounting plate 11 is 0.3 mm or more, the insulation of the mounting plate 11 is not broken by the voltage applied to the electrode for electrostatic attraction 13 and an electric discharge does not occur. Further, if the thickness of the mounting plate 11 is 0.3 mm or more, breakage and cracking do not occur during processing. On the other hand, if the thickness of the mounting plate 11 is 1.0 mm or less, it is possible to sufficiently attract and fix the plate-shaped sample W with a desired strength.

The first organic insulating layer 14 is a resin layer having insulation properties and voltage resistance. The first organic insulating layer 14 is preferably formed by bonding a film-shaped or sheet-shaped formation material. The first organic insulating layer 14 is bonded to the lower surface of the mounting plate 11 through an adhesive layer (not shown). A black line between the first organic insulating layer 14 and the mounting plate 11 can also be regarded as the adhesive layer. With respect to a high voltage which is applied to the electrode for electrostatic attraction 13, the mounting plate 11 and the first organic insulating layer 14 cooperate with each other to exhibit withstand voltage (dielectric breakdown voltage, (unit: kV)) at which dielectric breakdown does not occur.

The thickness of the first organic insulating layer 14 can be arbitrarily selected. However, the thickness is preferably 0.05 mm or more and 0.2 mm or less. The thickness of the first organic insulating layer 14 is a thickness which includes an adhesive layer which bonds the first organic insulating layer 14 and the mounting plate 11 together and an adhesive layer which bonds the first organic insulating layer 14 and the electrode for electrostatic attraction 13 together. If the thickness of the first organic insulating layer 14 is 0.05 mm or more, the insulation between the electrode for electrostatic attraction 13 and the mounting plate 11 is not broken by the voltage applied to the electrode for electrostatic attraction 13 and an electric discharge does not occur. On the other hand, if the thickness of the first organic insulating layer 14 is 0.2 mm or less, the distance between the electrode for electrostatic attraction 13 and the plate-shaped sample W does not become too far, and thus it is possible to sufficiently attract and fix the plate-shaped sample W with a desired strength.

The dielectric breakdown voltage of the first organic insulating layer 14 is preferably 5 kV or more. As a material for forming the first organic insulating layer 14, it is preferable to use, for example, a material exhibiting a dielectric breakdown strength (unit: kV/mm) capable of realizing a desired dielectric breakdown voltage in the thickness of the first organic insulating layer 14 described above. Further, it is favorable if it is a material having sufficient heat resistance not to cause deterioration or deformation at a temperature in the use environment of the electrostatic chuck device 1. As a material for forming the first organic insulating layer 14, polyimide resin, silicone resin, epoxy resin, or the like can be given as an example.

In general, these materials for forming the first organic insulating layer 14 have larger dielectric breakdown strength than the ceramic which is a material for forming the mounting plate 11. For example, the dielectric breakdown strength of polyimide resin is 300 kV/mm, which is very strong compared to the dielectric breakdown strength (10 kV/mm) of $Al_2O_3$—SiC which is a material for forming the mounting plate 11. For this reason, in a case of using the laminated body of the mounting plate 11 and the first organic insulating layer 14, compared to a case of using only the mounting plate 11, a larger dielectric breakdown voltage can be obtained even at the same thickness.

Further, in a case where a weak place liable to cause a pinhole defect is present in the mounting plate 11, in a configuration in which only the mounting plate 11 is used, if a high voltage is applied to the electrode for electrostatic attraction 13, a pinhole is easily generated in the weak place, and as a result, dielectric breakdown easily occurs.

On the other hand, in a case of using the laminated body of the mounting plate 11 and the first organic insulating layer 14, dielectric breakdown does not easily occur. That is, in a case where a weak place of the mounting plate 11 and a weak place of the first organic insulating layer 14 accidentally overlap in plan, so that overlapping of weak places occurs, eventually, a place where a pinhole defect easily occurs is formed in the laminated body as a whole. For this reason, even if a weak place is present in the mounting plate 11 or the first organic insulating layer 14, a problem hardly occurs.

Variation in the in-plane thickness of the first organic insulating layer 14 is preferably within 50 μm and more preferably within 10 μm. If variation in the in-plane thickness of the first organic insulating layer 14 is 50 μm or less, a difference in height is not easily generated in a temperature distribution according to the magnitude of the thickness. As a result, the temperature control by thickness adjustment of the first organic insulating layer 14 is not adversely affected, and thus it is preferable. Further, an attraction force does not easily become uneven in the plane of the mounting surface 19, and thus it is preferable.

The thermal conductivity of the first organic insulating layer 14 is preferably 0.05 W/mk or more and more preferably 0.1 W/mk or more. If the thermal conductivity is 0.05 W/mk or more, the thermal conduction from the electrostatic chuck member 2 to the temperature controlling base member 3 through the second organic insulating layer 7 is easy, so that a cooling rate does not decrease, and thus it is preferable. Further, it is favorable if the thermal conductivity of the first organic insulating layer 14 is controlled such that the heat transfer rate between the mounting plate 11 and the electrode for electrostatic attraction 13 is greater than 750 $W/m^2K$ and more preferably greater than 4000 $W/m^2K$.

The electrode for electrostatic attraction 13 is used as an electrode for an electrostatic chuck for generating electric charges and fixing the plate-shaped sample W with an electrostatic attraction force. The shape or size of the electrode is appropriately adjusted according to a use thereof. For example, the electrode for electrostatic attraction 13 is provided as an electrode having a predetermined pattern in a layer portion where the electrode for electrostatic attraction 13 is formed. The electrode for electrostatic attraction 13 functions even if it is provided as a so-called solid electrode which does not have a pattern.

The electrode for electrostatic attraction 13 may be formed by an arbitrary method. For example, the electrode for electrostatic attraction 13 can be formed by bonding nonmagnetic metal foil which is a material for forming the electrode for electrostatic attraction 13 to the first organic insulating layer 14, or by forming a film by sputtering or vapor deposition. In addition, the electrode for electrostatic attraction 13 can be formed by applying a compound material of a conductive material, which is a material for forming the electrode for electrostatic attraction 13, and an organic material by using a coating method such as screen printing. Further, the electrode for electrostatic attraction 13 may be installed in the interior of the mounting plate 11.

The electrode for electrostatic attraction 13 may be formed of a material which is arbitrarily selected. For example, the electrode can be formed of conductive ceramic such as an aluminum oxide-tantalum carbide ($Al_2O_3$—$Ta_4C_5$) conductive compound sintered compact, an aluminum oxide-tungsten ($Al_2O_3$—W) conductive compound sintered compact, an aluminum oxide-silicon carbide ($Al_2O_3$—SiC) conductive compound sintered compact, an aluminum nitride-tungsten (AlN—W) conductive compound sintered compact, an aluminum nitride-tantalum (AlN—Ta) conductive compound sintered compact, or an yttrium oxide-molybdenum ($Y_2O_3$—Mo) conductive compound sintered compact, or high melting point metal such as tungsten (W), tantalum (Ta), or molybdenum (Mo). Further, the electrode for electrostatic attraction 13 can also be formed of copper (Cu), aluminum (Al), or carbon (C). These may be used alone or in combination of two or more.

The thickness of the electrode for electrostatic attraction 13 can be arbitrarily selected and is not particularly limited. However, the thickness of the electrode for electrostatic attraction 13 is preferably 0.1 μm or more and 50 μm or less. If the thickness is 0.1 μm or more, sufficient electrical conductivity can be secured. On the other hand, if the thickness is 50 μm or less, cracking due to a difference in coefficient of thermal expansion between the electrode for electrostatic attraction 13 and the mounting plate 11 does not easily occur in the joint interface between the electrode for electrostatic attraction 13 and the mounting plate 11.

The size of the electrode for electrostatic attraction 13 can be arbitrarily selected. For example, the electrode for electrostatic attraction 13 may have the same size as the first organic insulating layer 14 when viewed in a planar view. However, the electrode for electrostatic attraction 13 may have a configuration in which it is smaller than the first organic insulating layer 14 when viewed in a planar view. By making the electrode for electrostatic attraction 13 have a configuration in which it is smaller than the first organic insulating layer 14 when viewed in a planar view, a structure is made in which the first organic insulating layer 14 is also present obliquely upward from an end portion of the electrode for electrostatic attraction 13 toward the outside of the device. For this reason, due to providing the first organic insulating layer 14 not only vertically above the electrode for electrostatic attraction 13 but also obliquely above the electrode for electrostatic attraction 13, it is possible to obtain the effect of improving withstand voltage, and thus it is possible to suppress dielectric breakdown.

The power supply terminal 15 is a rod-shaped terminal provided in order to apply a direct-current voltage to the electrode for electrostatic attraction 13. A material for forming the power supply terminal 15 is not particularly limited as long as it is an electrically conductive material having excellent heat resistance, and a metal material or a conductive organic material can be used. The electric conductivity of the power supply terminal 15 is preferably $10^4$ Ω·cm or less.

It is preferable that the power supply terminal 15 has a coefficient of thermal expansion close to the coefficient of thermal expansion of the electrode for electrostatic attraction 13. For example, conductive ceramic configuring the electrode for electrostatic attraction 13 or a metal material such as tungsten (W), tantalum (Ta), molybdenum (Mo), niobium (Nb), or a kovar alloy is suitably used. The power supply terminal 15 is insulated from the temperature controlling base member 3 by an insulator 23 having insulation properties.

The temperature controlling base member 3 is disposed on the side opposite to the mounting plate 11 side of the electrode for electrostatic attraction 13 (below the electrode for electrostatic attraction 13) and cools the mounting plate 11 to control the temperature of the mounting plate 11 to a desired temperature. The temperature controlling base member 3 has a thick disk shape. Further, the temperature controlling base member 3 is formed to be greater than the electrostatic chuck member 2 (the electrode for electrostatic attraction 13 and the first organic insulating layer 14) when viewed from above.

As the temperature controlling base member 3, for example, a water-cooled base or the like, in which a flow path (not shown) for circulating water is formed in the interior thereof, is suitable.

The temperature controlling base member 3 is provided with the groove portion 6 which accommodates the end part 5a which is located on the lower side of the dike portion 5 of the mounting plate 11. The groove portion 6 is disposed at a position overlapping the dike portion 5 when viewed in a planar view and is formed to be wider than the dike portion 5. A gap is provided between the groove portion 6 and the dike portion 5, and a filling part 8a which is a part of the adhesive layer 8 is provided in the gap.

Figure 5:
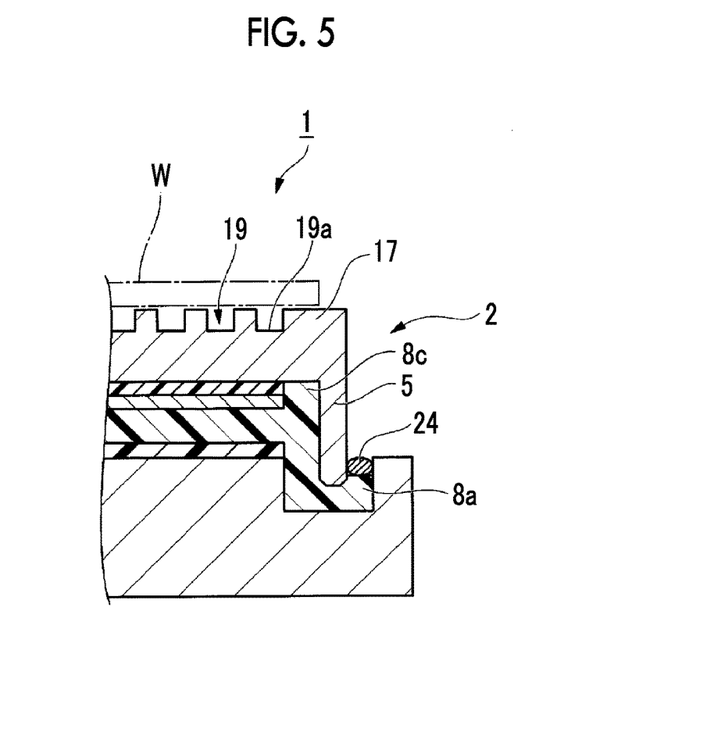
FIG. 5 is a sectional view showing another preferred example of the electrostatic chuck device according to the first embodiment.

An O-ring may be provided at a portion which is exposed to the outside, of the filling part 8a, as shown in FIG. 5. The portion which is exposed to the outside, of the filling part, is covered with the O-ring, whereby infiltration of plasma is further prevented and the etching rate of the filling part is lowered, and thus the life of the electrostatic chuck device can be prolonged. The material, size, and sectional shape of the O-ring can be arbitrarily selected, and an annular seal member made of an elastic body such as rubber or elastomer resin is preferably used. In this embodiment, a case where the O-ring having a circular cross section is adopted as the seal member is exemplified. However, there is no limitation thereto. In particular, in a case where the sectional shape of a space in which the seal member is accommodated is rectangular as shown in this embodiment, the infiltration of plasma may be more effectively suppressed by increasing a contact area by using a packing having a rectangular cross section.

The depth of the groove portion 6 can be arbitrarily selected. However, it is preferable that the depth is 0.5 mm or more and 12.0 mm or less. Further, the width (that is, the width dimension along the radial direction of the electrostatic chuck device 1) of the groove portion 6 can also be arbitrarily selected. However, it is preferable that the width is 0.5 mm or more and 1.2 mm or less. Further, it is preferable that a portion of 0.3 mm or more and 10.0 mm or less from the end part 5a, of the dike portion 5, in a depth direction of the groove portion 6, is located inside the groove portion 6, that is, in the interior of the groove portion.

By adopting such dimensions, it is possible to sufficiently secure the thickness of the filling part 8a filled between the groove portion 6 and the dike portion 5 and prolong the life of the electrostatic chuck device 1, as will be described later.

In this embodiment, the height of a portion which is located inside the groove portion 6, of the upper surface 3a of the temperature controlling base member 3, and the height of a portion which is located outside the groove portion 6, of the upper surface 3a, coincide with each other. However, a configuration may be acceptable in which one of these portions is located on the upper side and the other portion is located on the lower side. That is, the upper surface of the temperature controlling base member 3 may have a plurality of upper surfaces different in height from each other.

As a material configuring the temperature controlling base member 3, as long as it is metal which is excellent in thermal conductivity, electric conductivity, and workability, or a compound material which includes the metal, it can be preferably used and there is no particular limitation. For example, aluminum (Al), an aluminum alloy, copper (Cu), a copper alloy, stainless steel (SUS), titanium, or the like is suitably used. It is preferable that at least the surface which is exposed to plasma, of the temperature controlling base member 3, is subjected to alumite treatment or has an insulating film such as alumina formed thereon.

The second organic insulating layer 7 is preferably a film-shaped or sheet-shaped resin having insulation properties and voltage resistance, although it can be arbitrarily selected, and is provided between the temperature controlling base member 3 and the electrode for electrostatic attraction 13. In this embodiment, the second organic insulating layer 7 is bonded to the upper surface of the temperature controlling base member 3 through an adhesive layer (not shown). A black line between the second organic insulating layer 7 and the temperature controlling base member 3 may be regarded as the adhesive layer.

In the electrostatic chuck device 1 of this embodiment, in a case where a high voltage is applied to the electrode for electrostatic attraction 13 in order to obtain a strong electrostatic attraction force, above the electrode for electrostatic attraction 13, the mounting plate 11 and the first organic insulating layer 14 cooperate with each other to realize high withstand voltage. On the other hand, below the electrode for electrostatic attraction 13, if a high voltage is applied to the electrode for electrostatic attraction 13, in a case where there is no voltage-resistant member, dielectric breakdown occurs between the electrode for electrostatic attraction 13 and the temperature controlling base member 3, and thus there is a possibility that an electric discharge may occur. However, in the electrostatic chuck device 1 of this embodiment, the second organic insulating layer 7 is provided. The second organic insulating layer 7 is provided, whereby the electrode for electrostatic attraction 13 and the temperature controlling base member 3 are insulated from each other such that an electric discharge due to a high voltage which is applied to the electrode for electrostatic attraction 13 does not occur between the electrode for electrostatic attraction 13 and the temperature controlling base member 3.

The second organic insulating layer 7 can have the same configuration (forming material and thickness) as that of the first organic insulating layer 14 described above. However, the first organic insulating layer 14 and the second organic insulating layer 7 may have the same configuration or may have different configurations.

An adhesion material which forms the first organic insulating layer 14 and the second organic insulating layer 7 can be arbitrarily selected. For example, a sheet-shaped or film-shaped adhesive resin having heat resistance and insulation properties and made of polyimide resin, silicone resin, epoxy resin, or the like can be preferably used, and the thickness thereof is preferably in a range of 5 μm to 100 μm and more preferably in a range of 10 μm to 50 μm.

Variation in the in-plane thickness of the adhesion material is preferably within 10 μm. If variation in the in-plane thickness of the adhesion material is within 10 μm, the accuracy of the temperature control of the electrostatic chuck member 2 by the temperature controlling base member 3 falls within an allowable range in a plane, and thus it is possible to make the in-plane temperature in the mounting surface 19 of the electrostatic chuck member 2 uniform.

The adhesive layer 8 is interposed between the lower surface of the electrostatic chuck member 2 and the upper surface of the temperature controlling base member 3. The adhesive layer 8 covers the side surfaces of the first organic insulating layer 14, the electrode for electrostatic attraction 13, and the second organic insulating layer 7 and bonds and integrates the electrostatic chuck member 2 and the temperature controlling base member 3 together. Further, the adhesive layer 8 has action of relaxing thermal stress.

The adhesive layer 8 is classified into three regions; the filling part 8a, an interposing part 8b, and an electrode surrounding part 8c, according to positions.

That is, the adhesive layer 8 has the filling part 8a, the interposing part 8b, and the electrode surrounding part 8c. The thickness of each part (that is, each of the filling part 8a, the interposing part 8b, and the electrode surrounding part 8c) of the adhesive layer 8 is not particularly limited and can be arbitrarily selected. However, the thickness is preferably 100 μm or more and 200 μm or less.

The groove portion 6 of the temperature controlling base member 3 is filled with the filling part 8a, and the filling part 8a fills the gap between the groove portion 6 and the dike portion 5. More specifically, the filling part 8a is located on the lower side of the end part 5a of the dike portion 5, and the inside in the radial direction and the outside in the radial direction with respect to the dike portion 5.

The filling part 8a has an exposed portion 8d which is exposed to the outside on the outside of the dike portion 5. In the adhesive layer 8, the exposed portion 8d is etched by being irradiated with plasma in a semiconductor manufacturing process, and thus the exposed portion 8d retreats, that is, the exposed portion 8d is displaced downward. The filling part 8a has a convoluted shape surrounding the vicinity of the end part 5a of the dike portion 5. For this reason, it is possible to lengthen an etching path, and thus it is possible to lengthen a time which is required for the filling part 8a to completely disappear. That is, for example, it is possible to lengthen a time until the electrode for electrostatic attraction 13 is exposed as etching progresses, and thus the life of the electrostatic chuck device 1 can be prolonged.

In addition, in the filling part 8a, it becomes difficult for plasma to reach the exposed portion 8d as the exposed portion 8d retreats with the progress of etching. For example, if the original exposed portion of the filling part 8a in the adhesive layer 8 is etched and disappears, a state is created where the exposed portion 8d is formed at the bottom of a U-shaped path formed by the groove portion 6 and the dike portion 5. In this state, unless the plasma moving through the U-shaped path reaches the exposed portion 8d while changing a traveling direction to a downward direction, a radially inward direction, and an upward direction in order along the inside of the U-shaped path, the etching of the exposed portion 8d cannot be performed. For this reason, the etching rate is remarkably lowered, and as a result, the life of the electrostatic chuck device 1 can be prolonged.

Further, the filling part 8a is disposed so as to sandwich the dike portion 5 from the inside and outside in the radial direction and to connect the dike portion 5 at a lower portion. With this disposition, stresses due to thermal expansion or thermal shrinkage of the filling part 8a cancel each other out, and thus a load which is applied to the dike portion 5 can be reduced.

The interposing part 8b is located between the electrode for electrostatic attraction 13 and the temperature controlling base member 3. The interposing part 8b has a main function to bond and integrate the electrostatic chuck member 2 and the temperature controlling base member 3 together, relax thermal stress, and transfer heat. In the interposing part 8b, it is desirable that there are no or few voids or defects in the interior thereof, the interface with the electrostatic chuck member 2, and the interface with the temperature controlling base member 3. If the voids or the defects are not formed or are few, the thermal conductivity is not lowered and the in-plane temperature distribution of the plate-shaped sample W becomes uniform, and thus it is preferable.

The electrode surrounding part 8c is located between the peripheral edge of the electrode for electrostatic attraction 13 and the dike portion 5 to surround the electrode for electrostatic attraction 13. The electrode surrounding part 8c is located above the filling part 8a. The electrode surrounding part 8c surrounds the electrode for electrostatic attraction 13. The electrode surrounding part 8c is provided, whereby it is possible to lengthen a time until the electrode for electrode for electrostatic attraction 13 is exposed as the etching of the adhesive layer 8 progresses. In addition, the electrode surrounding part 8c suppresses an electric discharge from the side surfaces of the first organic insulating layer 14 and the electrode for electrostatic attraction 13, and thus the withstand voltage of the entire device is improved.

The adhesive layer 8 can be formed of a material which is arbitrarily selected. However, the adhesive layer 8 is formed of, for example, a cured body obtained by thermally curing a silicone-based resin composition, or acrylic resin. The adhesive layer 8 is preferably formed by filling a fluid resin composition between the electrostatic chuck member 2 and the temperature controlling base member 3 and then thermally curing the fluid resin composition.

The adhesive layer 8 may be configured of a single resin material. However, the adhesive layer 8 may be configured of two or more types of resin materials divided into portions different from each other. In this case, for example, the following configuration can be given as a preferred example.

The adhesive layer 8 is formed of a first resin material and a second resin material which configure portions different from each other. The second resin material is made of a material having more excellent plasma resistance than the first resin material. The portion which is configured of the second resin material is located on the side closer to the exposed portion 8d that is a portion which is exposed to the outside, of the adhesive layer 8, than the portion which is configured of the first resin material. As an example thereof, a configuration can be given in which the filling part 8a and the electrode surrounding part 8c of the adhesive layer 8 are configured of the second resin material and the interposing part 8b is configured of the first resin material. As another example, a configuration can be given in which only the filling part 8a of the adhesive layer 8 is configured of the second resin material and the interposing part 8b and the electrode surrounding part 8c are configured of the second resin material. As still another example, an example can be given in which only a part on the exposed portion 8d side of the filling part 8a is configured of the second resin material. That is, it is preferable that the portion which is made of the second resin material is a region which includes at least the exposed portion 8d and is continuous with other regions. In the adhesive layer 8, the portion which includes the exposed portion 8d is configured of the second material, whereby it is possible to delay the progress of etching by plasma, and thus the life of the electrostatic chuck device 1 can be prolonged.

It is preferable that the first resin material configures the portion which includes at least the interposing part 8b. In this case, it is preferable that the first resin material is made of a material having stronger adhesive force than the second resin material. With this configuration, the electrostatic chuck member 2 and the temperature controlling base member 3 can be strongly bonded together by the interposing part 8b.

In this manner, the adhesive layer 8 is configured of different materials suitable for the respective portions which preferably requires different functions, whereby it can contribute to the extension of the life of the electrostatic chuck device 1.

The upper surface of the temperature controlling base member 3 and the lower surface of the electrostatic chuck member 2 may not be necessarily flat. By forming the adhesive layer 8 by filling a space between the temperature controlling base member 3 having the groove portion 6 and the electrostatic chuck member 2 with a fluid resin composition and then curing the fluid resin composition, that is, by using a resin composition which changes a shape along the shapes of the electrostatic chuck member 2 and the temperature controlling base member 3, it is possible to suppress the occurrence of voids between the electrostatic chuck member 2 and the temperature controlling base member 3, and the adhesive layer 8, due to the irregularities of the electrostatic chuck member 2 and the temperature controlling base member 3. In this way, since there are no or few voids, it is possible to make the heat conduction characteristics of the adhesive layer 8 uniform in a plane and enhance the temperature uniformity of the electrostatic chuck member 2.

Further, in the electrostatic chuck device 1, a cooling gas introduction hole (a through-hole) 18 penetrating the entire device in the thickness direction is formed. Cooling gas such as He is supplied from the cooling gas introduction hole 18. The cooling gas flows through the gap between the mounting surface 19 of the electrostatic chuck member 2 and the lower surface of the plate-shaped sample W. Due to this flow, the heat transfer rate between the mounting surface 19 and the plate-shaped sample W increases, thereby serving to lower the temperature of the plate-shaped sample W. The peripheral wall 17 of the mounting plate 11 suppresses the leakage of the cooling gas which is introduced between the mounting surface 19 and the plate-shaped sample W. According to the formation of the cooling gas introduction hole 18, a first through-hole 11h penetrating in the thickness direction of the mounting plate 11 is provided in the mounting plate 11 as well. The electrode for electrostatic attraction 13 is formed to avoid the cooling gas introduction hole 18. A second through-hole 14h penetrating in the thickness direction of the first organic insulating layer 14 and communicating with the first through-hole 11h is provided in the first organic insulating layer 14. The second through-hole 14h is formed to be larger than the first through-hole 11h when viewed in a planar view. The side surface (denoted by reference numeral 13h in the drawing) of the electrode for electrostatic attraction 13 and the side surface of the second through-hole 14h are covered with the adhesive layer 8. Further, a through-hole 7h penetrating in the thickness direction of the second organic insulating layer 7 is provided in the second organic insulating layer 7.

In addition, the electrostatic chuck device 1 may be provided with a plurality of through-holes for inserting lift pins for pushing up the plate-shaped sample W. Further, a heater which is mounted on the lower surface 11a of the mounting plate 11 to heat the mounting plate 11 may be provided.

The electrostatic chuck device 1 of this embodiment has the configuration as described above.

According to the electrostatic chuck device 1 of this embodiment, the end part 5a of the dike portion 5 of the mounting plate 11 is accommodated in the groove portion 6 of the temperature controlling base member 3. In this way, the filling part 8a of the adhesive layer 8 filled in the gap between the mounting plate 11 and the temperature controlling base member 3 has a labyrinth structure which is convoluted along the surface of the dike portion 5. The filling part 8a has the exposed portion 8d which is exposed to the outside on the outside of the dike portion 5. In the semiconductor manufacturing process, the exposed portion 8d of the filling part 8a is etched by plasma, thereby gradually retreating. According to this embodiment, the path from the filling part 8a to the electrode for electrostatic attraction 13 becomes longer. For this reason, even in a case where etching has progressed, the electrode for electrostatic attraction 13 is hard to be exposed, and thus an electric discharge from the electrode for electrostatic attraction 13 can be prevented. In addition, the filling part 8a has a convoluted labyrinth structure, whereby in a case where the exposed portion 8d of the filling part 8a has retreated, due to the exposed portion 8d being located before the convoluted portion, it is difficult for plasma to reach the exposed portion 8d, and thus the etching of the filling part 8a can be delayed.

It is preferable that the dike portion 5 has a closed-circular shape. Further, it is preferable that the groove portion 6 is a groove having a closed-circular shape corresponding to the dike portion 5. Each of the dike portion 5 and the groove portion 6 is formed in a closed-circular shape, whereby the adhesive layer 8 between the mounting plate 11 and the temperature controlling base member 3 can have a convoluted shape over the entire circumference. For this reason, the exposure of the electrode for electrostatic attraction 13 can be reliably delayed. Therefore, it is possible to prolong the life of the electrostatic chuck device 1.

Modification examples which are preferred examples of the first embodiment will be described below. The conditions of the modification examples may be combined with each other.

Modification Example 1

Next, an electrostatic chuck device 101 of Modification Example 1 which is a preferred example of the present invention will be described.

Figure 2:
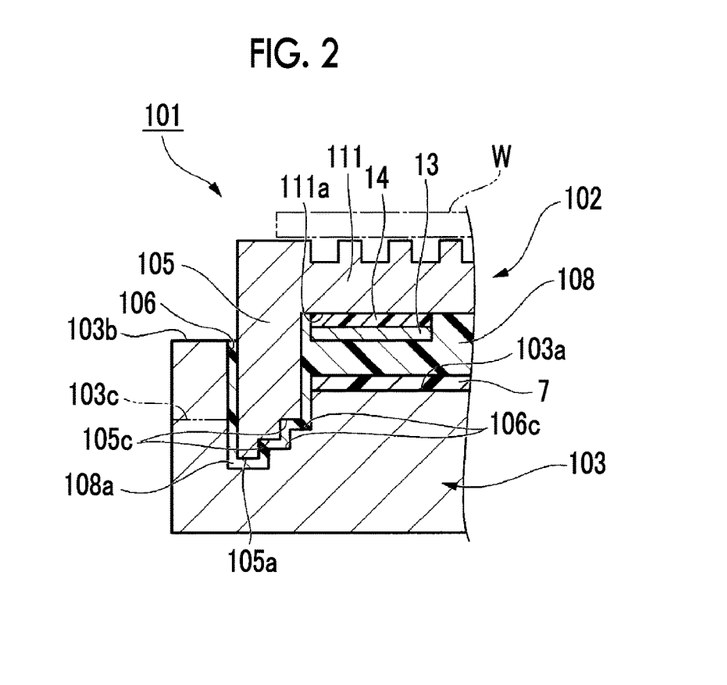
FIG. 2 is a partial sectional view showing a preferred example of an electrostatic chuck device according to Modification Example 1.

FIG. 2 is a partial sectional view of the electrostatic chuck device 101. The electrostatic chuck device 101 of Modification Example 1 is different from the electrostatic chuck device 1 of the above-described embodiment mainly in terms of the configurations of the dike portion and the groove portion. The constituent elements of the same aspect as that of the above-described embodiment are denoted by the same reference numerals and description thereof is often omitted.

The electrostatic chuck device 101 is provided with an electrostatic chuck member 102, a temperature controlling base member 103, an adhesive layer 108, and the second organic insulating layer 7. The electrostatic chuck member 102 has a mounting plate (a ceramic plate) 111 on which the plate-shaped sample W is mounted, the electrode for electrostatic attraction 13, and the first organic insulating layer 14. The mounting plate 111 has a dike portion 105 which extends from the periphery of a lower surface 111a toward the temperature controlling base member 103 side (that is, the lower side). A groove portion 106 which accommodates an end part 105a located on the lower side of the dike portion 105 of the mounting plate 111 is provided in the temperature controlling base member 103.

Steps which stepwise decrease the width of the dike portion (the thickness of the dike portion when viewed from a cross section) toward the end part 105a on the temperature controlling base member 103 side are formed in the dike portion 105, and accordingly, two dike-portion-side step surfaces 105c are provided. In this example, when viewed from the cross section, three steps are provided. The number of the dike-portion-side step surfaces can be arbitrarily selected, and for example, 1, 2, 3, 4, or the like can be given as examples. Here, the end part 105a is not included in the dike-portion-side step surfaces. In this modification example, the two dike-portion-side step surfaces 105c are located at an inner side portion of the dike portion 105 with respect to the end part 105a of the dike portion 105 and provide a stair-like structure to the dike portion. Each of the two dike-portion-side step portions 105c is a surface facing downward. The width of the dike-portion-side step surface, the distance between the dike-portion-side step surfaces, and the number of steps can be arbitrarily selected.

Two groove-portion-side step surfaces 106c which reduce the width of the groove portion toward the bottom side are provided in the groove portion 106 to correspond to the two dike-portion-side step surfaces 105c. Each of the groove-portion-side step surfaces 106c is a surface facing upward. The groove-portion-side step surfaces 106c face the dike-portion-side step surfaces 105c in the up-down direction.

A gap is provided between the groove portion 106 and the dike portion 105. A filling part 108a which is a part of the adhesive layer 108 is provided in the gap. According to this modification example, since the step surfaces 105c and 106c facing each other are provided in the dike portion 105 and the groove portion 106, a path which is formed by the gap filled with the filling part 108a becomes longer. In this way, it is possible to lengthen a time which is required until the filling part 108a completely disappears, and thus the life of the electrostatic chuck device 101 can be prolonged.

In this modification example, an outer upper surface 103b which is a part of the upper surface of the temperature controlling base member 103 and is located outside the groove portion 106 is located on the upper side with respect to an inner upper surface 103a which is located inside the groove portion 106. In this way, it is possible to make the path of the filling part 108a longer on the outside of the dike portion 105. However, the electrostatic chuck device 101 is not limited to only such a form. The outer upper surface 103b may be provided at the same height or a lower height. For example, as shown by a two-dot chain line in FIG. 2, an outer upper surface 103c which is located further on the lower side than the inner upper surface 103a may be provided.

Modification Example 2

Next, an electrostatic chuck device 201 of Modification Example 2 which is a preferred example of the present invention will be described.

Figure 3:
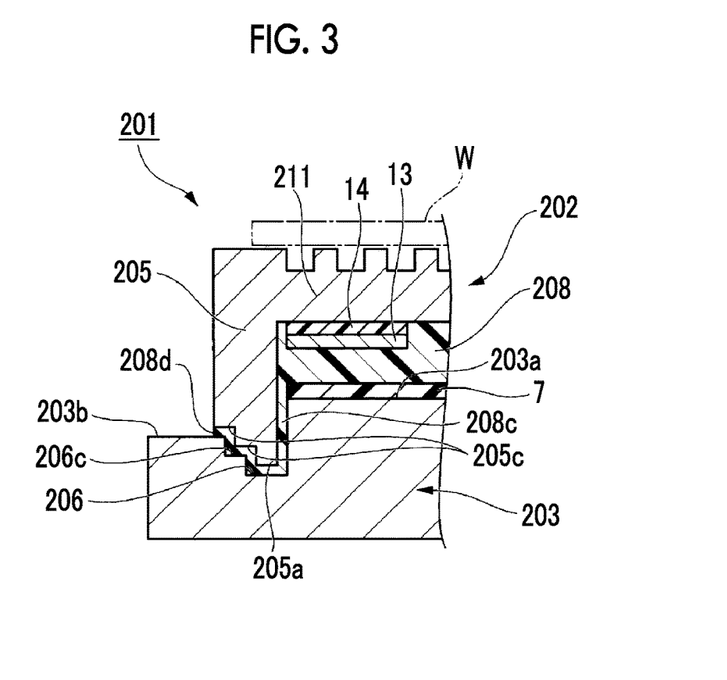
FIG. 3 is a partial sectional view showing a preferred example of an electrostatic chuck device according to Modification Example 2.

FIG. 3 is a partial sectional view of the electrostatic chuck device 201. The electrostatic chuck device 201 of Modification Example 2 has a combination of a dike-portion-side step surface and a groove-portion-side step surface, similar to the electrostatic chuck device 101 of Modification Example 1, and specifically has a dike-portion-side step surface 205c and a groove-portion-side step surface 206c. However, a position and a direction in which the dike-portion-side step surface 205c and the groove-portion-side step surface 206c are provided are different from those in Modification Example 1. The constituent elements of the same aspect as those of the above-described embodiment and modification example are denoted by the same reference numerals and description thereof is often omitted.

The electrostatic chuck device 201 is provided with an electrostatic chuck member 202, a temperature controlling base member 203, an adhesive layer 208, and the second organic insulating layer 7. The electrostatic chuck member 202 has a mounting plate (a ceramic plate) 211 on which the plate-shaped sample W is mounted, the electrode for electrostatic attraction 13, and the first organic insulating layer 14. The mounting plate 211 has a dike portion 205 in which two dike-portion-side step surfaces 205c are provided on the end part 205a side. A groove portion provided with a single groove-portion-side step surface 206c is formed in the temperature controlling base member 203. The number of steps can be arbitrarily selected.

In this modification example, the two dike-portion-side step surfaces 205c are provided. The two dike-portion-side step surfaces 205c are located at an outer side portion of the dike portion 205 with respect to the end part 205a of the dike portion 205. The dike-portion-side step surfaces 205c are surfaces facing downward and face the groove-portion-side step surface 206c facing upward.

In this modification example, an outer upper surface 203b which is a part of the upper surface of the temperature controlling base member 203 and is located outside the groove portion 206 is located on the lower side with respect to an inner upper surface 203a of the base member 203, which is located inside the groove portion 206. Further, a part of the outer upper surface 203b faces one dike-portion-side step surface 205c facing downward.

A gap is provided between the groove portion 206 and the dike portion 205, and a filling part 208a which is a part of the adhesive layer 208 is provided in the gap. The filling part 208a has an exposed portion 208d which is exposed to the outside from between the outer peripheral surface of the dike portion 205 and the outer upper surface 203b of the temperature controlling base member. The exposed surface of the exposed portion 208d of this modification example faces the outside in the radial direction of the electrostatic chuck device 201.

According to this modification example, similar to Modification Example 1 described above, the path of the gap filled with the filling part 208a is lengthened, and thus the life of the electrostatic chuck device 201 can be prolonged.

Modification Example 3

Next, an electrostatic chuck device 301 of Modification Example 3 which is a preferred example of the present invention will be described.

Figure 4:
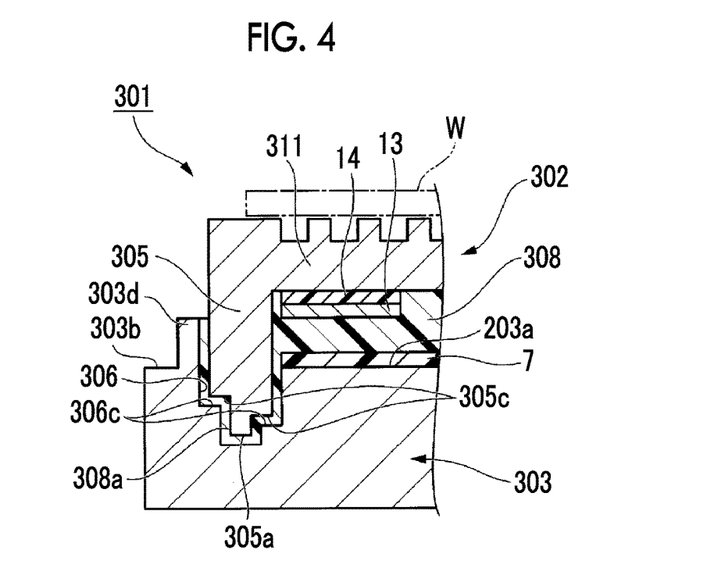
FIG. 4 is a partial sectional view showing a preferred example of an electrostatic chuck device according to Modification Example 3.

FIG. 4 is a partial sectional view of the electrostatic chuck device 301. The electrostatic chuck device 301 of Modification Example 3 has a combination of a dike-portion-side step surface and a groove-portion-side step surface, similar to the electrostatic chuck devices 101 and 201 of Modification Examples 1 and 2, and specifically has a dike-portion-side step surface 305c and a groove-portion-side step surface 306c. However, a configuration such as a position or a shape thereof is different from those in Modification Examples 1 and 2. The constituent elements of the same aspect as those of the above-described embodiment and modification examples are denoted by the same reference numerals and description thereof is often omitted.

The electrostatic chuck device 301 is provided with an electrostatic chuck member 302, a temperature controlling base member 303, an adhesive layer 308, and the second organic insulating layer 7. The electrostatic chuck member 302 has a mounting plate (a ceramic plate) 311 on which the plate-shaped sample W is mounted, the electrode for electrostatic attraction 13, and the first organic insulating layer 14. The mounting plate 311 has a dike portion 305 in which the dike-portion-side step surface 305c is provided on the end part 305a side. A groove portion provided with the groove-portion-side step surface 306c which corresponds to, that is, faces the dike-portion-side step surface 305c is formed in the temperature controlling base member 303. The number of steps can be arbitrarily selected.

In this modification example, two dike-portion-side step surfaces 305c are provided. The two dike-portion-side step surfaces 305c are respectively located on the inside and the outside of the dike portion 305 with respect to the end part 305a of the dike portion 305. The dike-portion-side step surfaces 305c are surfaces facing downward and face the groove-portion-side step surfaces 306c of the temperature controlling base member 303 in the up-down direction. The heights of the dike-portion-side step surfaces 305c are different from each other. However, the heights may be the same.

A gap is provided between the groove portion 306 and the dike portion 305, and a filling part 308a which is a part of the adhesive layer 308 is provided in the gap. According to this modification example, similarly to Modification Examples 1 and 2 described above, the path of the gap filled with the resin material of the filling part 308a becomes longer, and thus the life of the electrostatic chuck device 301 can be prolonged.

In this modification example, an outer upper surface 303b which is a part of the upper surface of the temperature controlling base member 303 and is located outside the groove portion 306 has the same height as the inner upper surface 203a of the temperature controlling base member 303, which is located inside the groove portion 306. Further, a protrusion portion 303d extending upward from the outer upper surface 303b is provided at the outer peripheral edge of the groove portion 306. The protrusion portion 303d is provided, whereby it is possible to make the path of the filling part 308a on the outside of the dike portion 305 longer, and thus the life of the electrostatic chuck device 301 can be prolonged. The protrusion portion may be preferably used in other examples as well.

The preferred embodiments of the present invention have been described above with reference to the accompanying drawings. However, it goes without saying that the present invention is not limited to such examples. The shapes, combinations, or the like of the respective constituent members shown in the above-described examples are merely examples, and various modifications can be made based on design requirements or the like within a scope which does not depart from the gist of the present invention.

INDUSTRIAL APPLICABILITY

An electrostatic chuck device in which it is possible to prolong the life can be provided.

REFERENCE SIGNS LIST 1, 101, 201, 301: electrostatic chuck device
2, 102, 202, 302: electrostatic chuck member
3, 103, 203, 303: temperature controlling base member
3a, 103a, 203a: upper surface of temperature controlling base member
5, 105, 205, 305: dike portion
5a, 105a, 205a: end part of dike portion
5b, 5d: chamfered portion
6, 106, 206, 306: groove portion
7: second organic insulating layer
7h: through-hole of second organic insulating layer
8, 108, 208, 308: adhesive layer
8a, 108a, 208a, 308a: filling part
8b: interposing part
8c: electrode surrounding part
8d, 208d: exposed portion
11, 111, 211, 311: mounting plate (ceramic plate)
11a, 111a: lower surface of mounting plate
11c: recess portion
11h: first through-hole of mounting plate
13: electrode for electrostatic attraction
13h: side surface of electrode for electrostatic attraction
14: first organic insulating layer
14h: second through-hole of first organic insulating layer
15: power supply terminal
17: peripheral wall of mounting surface
18: cooling gas introduction hole
19: mounting surface
19a: groove portion on mounting surface
23: insulator
24: O-ring
30: protrusion portion on mounting surface
103b, 203b, 303b: outer upper surface of temperature controlling base member
103c: outer upper surface of temperature controlling base member
105c, 205c, 305c: dike-portion-side step surface
106c, 206c, 306c: groove-portion-side step surface
303d: protrusion portion of outer upper surface
W: plate-shaped sample

The invention claimed is:
1. An electrostatic chuck device comprising:
an electrostatic chuck member; and
a temperature controlling base member,
wherein the electrostatic chuck member includes
a ceramic plate whose one surface is a mounting surface to mount a plate-shaped sample, and
an electrode for electrostatic attraction which is provided on a surface side of the ceramic plate which is opposite to the mounting surface side,
wherein the temperature controlling base member is configured to cool the electrostatic chuck member, and is disposed on a surface side of the electrode for electrostatic attraction which is opposite to the ceramic plate side, wherein the ceramic plate includes a dike portion extending to the temperature controlling base member side and surrounding a periphery of the electrode for electrostatic attraction,
wherein the temperature controlling base member includes a groove portion that is configured to accommodate an end part of the dike portion, and
wherein a space between the groove portion and the dike portion is filled with a filling part which is formed of a resin material.

2. The electrostatic chuck device according to claim 1, wherein the dike portion has a closed-circular shape, and the groove portion is provided with a closed-circular groove which corresponds to the dike portion.

3. The electrostatic chuck device according to claim 1, wherein the dike portion has a step provided at the dike portion, in which a width of the dike portion decreases in a stepwise manner toward the end part of the dike portion, wherein the end part is positioned on the temperature controlling base member side, and
wherein the groove portion has a step provided at the groove portion, in which a width decreases toward a bottom side corresponding to the step provided at the dike portion.

4. The electrostatic chuck device according to claim 1, wherein the end part of the dike portion, in which the end part is positioned at the temperature controlling base member side, is a chamfered end part.

5. The electrostatic chuck device according to claim 1, wherein an exposed portion of the filling part which is exposed to the outside is covered with an O-ring.

6. The electrostatic chuck device according to claim 1, further comprising:
an adhesive layer which adheres the electrostatic chuck member and the temperature controlling base member to each other,
wherein the adhesive layer includes
the filling part, and
an interposing part, which is positioned between the electrode for electrostatic attraction and the temperature controlling base member.

7. The electrostatic chuck device according to claim 6, wherein the adhesive layer is divided into
a portion formed of a first resin material, and
a portion formed of a second resin material which has higher plasma resistance than that of the first resin material, and
wherein an exposed portion of the adhesive layer, which is exposed to the outside, is formed of the second resin material.

8. The electrostatic chuck device according to claim 1, further comprising:
a first organic insulating layer which is provided between the ceramic plate and the electrode for electrostatic attraction.

9. The electrostatic chuck device according to claim 1, further comprising:
a second organic insulating layer which is provided between the temperature controlling base member and the electrode for electrostatic attraction.

10. An electrostatic chuck device comprising:
a ceramic plate; and
a temperature controlling base member,
wherein the ceramic plate has one surface which is a mounting surface on which a plate-shaped sample is mounted,
wherein an electrode for electrostatic attraction is provided on the ceramic plate,
wherein the temperature controlling base member is a base member that is configured to cool the ceramic plate from a side opposite to the mounting surface of the ceramic plate,
wherein the ceramic plate includes a dike portion extending to the temperature controlling base member side and surrounding a periphery of the electrode for electrostatic attraction,
wherein the temperature controlling base member includes a groove portion that is configured to accommodate an end part of the dike portion, and
wherein a space between the groove portion and the dike portion is filled with a filling part formed of a resin material.

* * * * *